(12) United States Patent
Hatzilias et al.

(10) Patent No.: US 11,575,246 B2
(45) Date of Patent: Feb. 7, 2023

(54) WAFER LEVEL OPTIC AND ZONED WAFER

(71) Applicant: Meta Platforms Technologies, LLC, Menlo Park, CA (US)

(72) Inventors: Karol Constantine Hatzilias, Kenmore, WA (US); Christopher Yuan-Ting Liao, Seattle, WA (US); Robin Sharma, Redmond, WA (US); Gregory Olegovic Andreev, Kirkland, WA (US); Paul Armen Tchertchian, Fremont, CA (US); Andrew John Ouderkirk, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 387 days.

(21) Appl. No.: 16/675,513

(22) Filed: Nov. 6, 2019

(65) Prior Publication Data
US 2020/0153203 A1 May 14, 2020

Related U.S. Application Data

(60) Provisional application No. 62/758,458, filed on Nov. 9, 2018.

(51) Int. Cl.
*H01S 5/183* (2006.01)
*H01S 5/028* (2006.01)
*H01S 5/02* (2006.01)
*G02B 27/01* (2006.01)

(52) U.S. Cl.
CPC ............ *H01S 5/183* (2013.01); *H01S 5/0201* (2013.01); *H01S 5/028* (2013.01); *G02B 27/0172* (2013.01); *G02B 2027/0178* (2013.01)

(58) Field of Classification Search
CPC ........ H01S 5/183; H01S 5/0201; H01S 5/028; H01S 5/02253; H01S 5/0071; H01S 5/423; G02B 27/0172; G02B 2027/0178
See application file for complete search history.

(56) References Cited

U.S. PATENT DOCUMENTS

| 2007/0071056 A1* | 3/2007 | Chen | G01S 17/42 |
| | | | 372/50.124 |
| 2017/0069611 A1* | 3/2017 | Zhang | H01L 25/0753 |
| 2018/0038944 A1 | 2/2018 | Hellmig et al. | |

(Continued)

FOREIGN PATENT DOCUMENTS

| EP | 1919045 A2 | 5/2008 | |
| WO | WO-2006011370 A1 * | 2/2006 | ......... H01S 5/18341 |
| WO | 2019020395 A1 | 1/2019 | |

OTHER PUBLICATIONS

Machine Translation of WO2006/011370A1 (Year: 2006).*
(Continued)

*Primary Examiner* — Yuanda Zhang
(74) *Attorney, Agent, or Firm* — Freestone Intellectual Property Law PLLC; Aaron J. Visbeek

(57) ABSTRACT

A plurality of light sources such as vertical-cavity surface-emitting lasers (VCSELs) are configured to emit non-visible light through emission apertures. Optics are formed over the emission apertures of the plurality of light sources. The optics may provide different tilt angles or divergence angles to the non-visible light emitted by the light sources in the plurality of light sources.

14 Claims, 15 Drawing Sheets

(56) References Cited

U.S. PATENT DOCUMENTS

2018/0203247 A1  7/2018 Chen et al.
2020/0028329 A1* 1/2020 Gronenborn ........ H01S 5/18308
2020/0335942 A1* 10/2020 Carson ................ H01S 5/06226

OTHER PUBLICATIONS

International Searching Authority, Patent Cooperation Treaty, European Application No. PCT/US2019/060485, Notification Date: Jun. 24, 2020, 20 pages.
International Preliminary Report on Patentability for International Application No. PCT/US2019/060485, dated May 20, 2021, 14 Pages.
International Searching Authority, Patent Cooperation Treaty, European Application No. PCT/US2019/060485, Notification Date: Apr. 29, 2020, 16 pages.

* cited by examiner

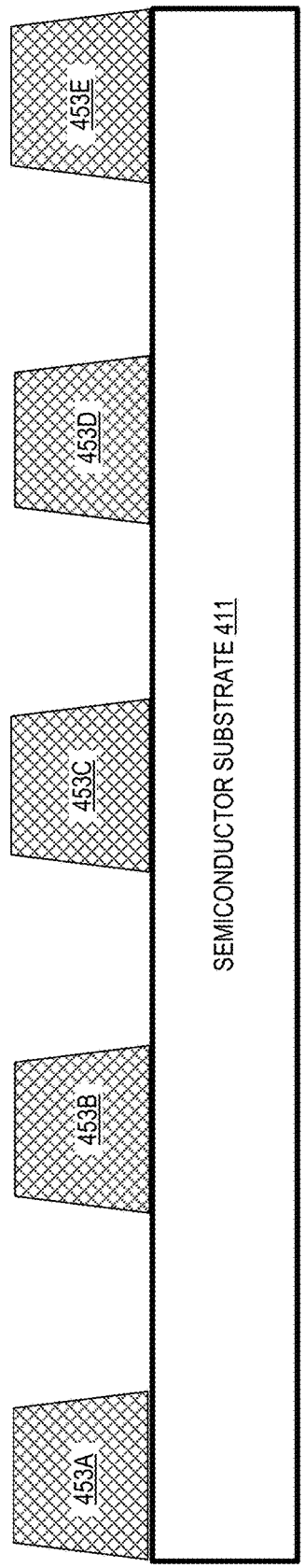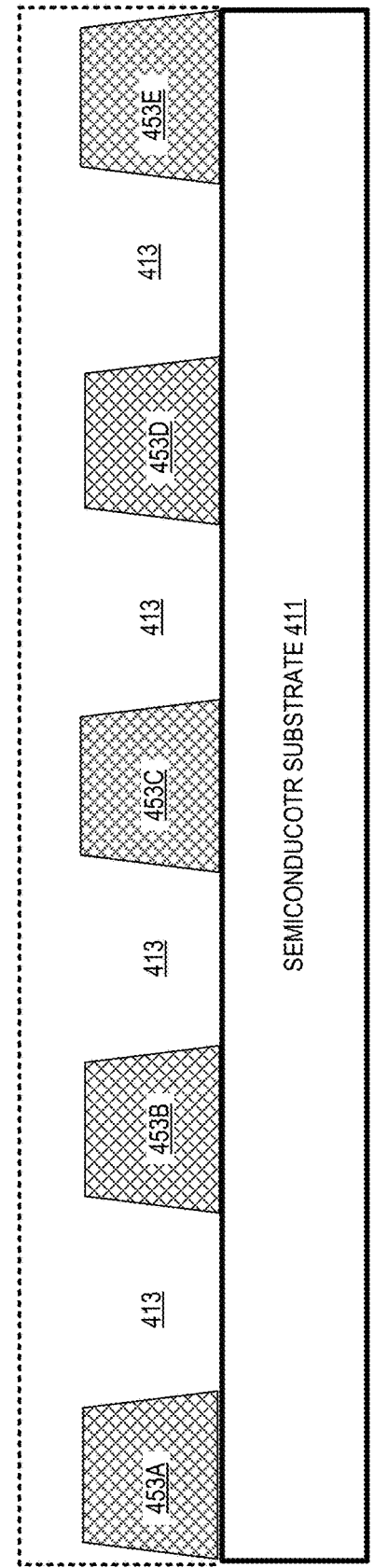

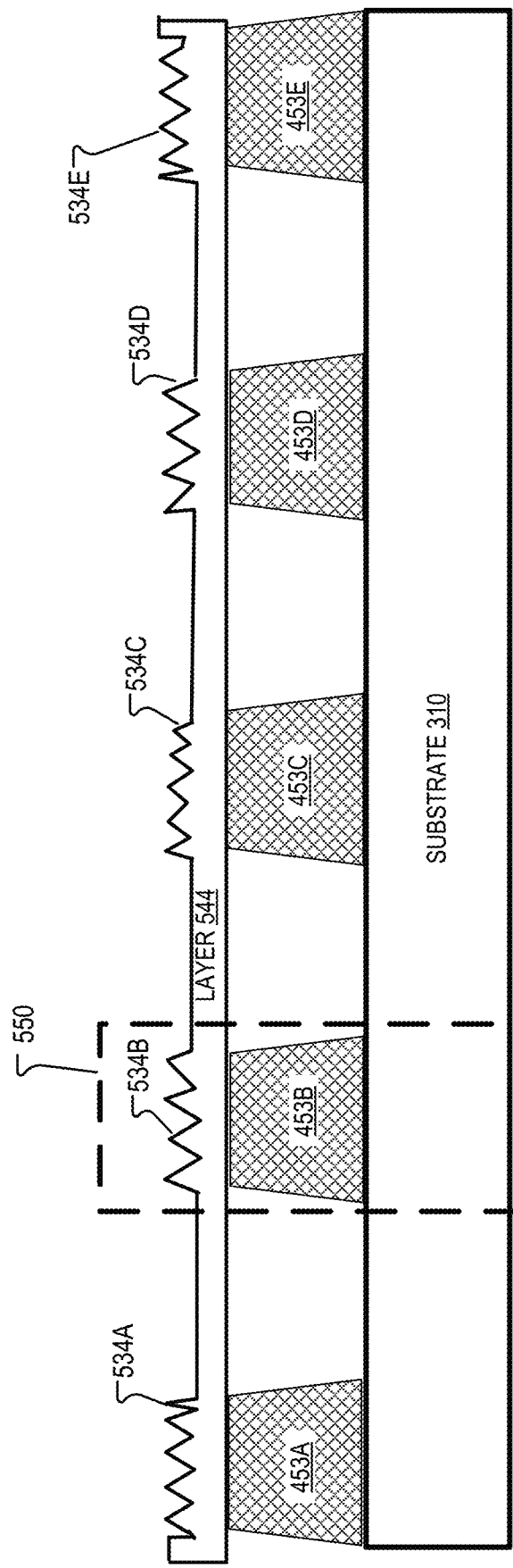

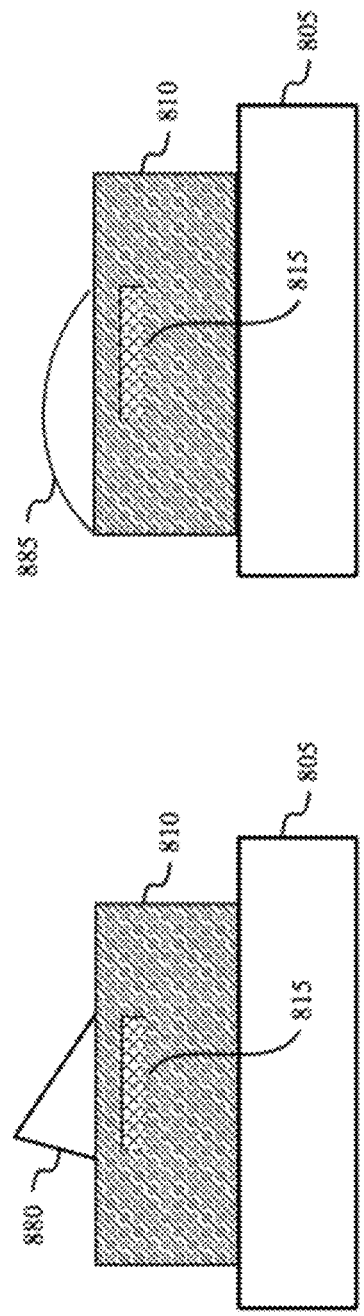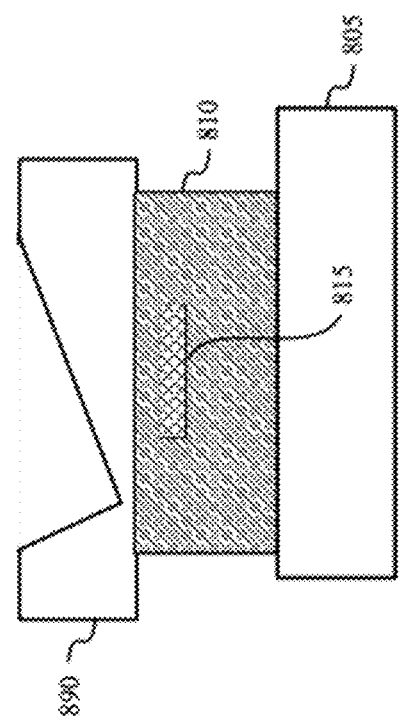

WAFER LEVEL OPTIC AND ZONED WAFER

CROSS REFERENCE TO RELATED APPLICATIONS

This application claims priority to U.S. provisional Application No. 62/758,458 filed Nov. 9, 2018, which is hereby incorporated by reference.

TECHNICAL FIELD

This disclosure relates generally to optics, and in particular to light sources such as a Vertical-Cavity Surface-Emitting Lasers (VCSELs).

BACKGROUND INFORMATION

There are a variety of application where light sources such as a VCSELs are utilized as light sources. VCSELs are used in fiber optic communication contexts and laser printers, for example. In one particular context, light sources may be utilized to illuminate a subject for purposes of imaging the subject.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIGS. 4A-4E illustrate an example wafer-level fabrication method of a placing wafer level optics ("WLOs") having different tilt angles and/or different beam divergence angles on VCSELs on the same wafer, in accordance with aspects of the disclosure.

FIGS. 5A-5B illustrate an example wafer-level fabrication method of a placing WLOs having different tilt angles and/or different beam divergence angles on VCSELs on the same wafer, in accordance with aspects of the disclosure.

FIGS. 8A-8F illustrate example beam diverging architectures, in accordance with aspects of the disclosure.

DETAILED DESCRIPTION

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
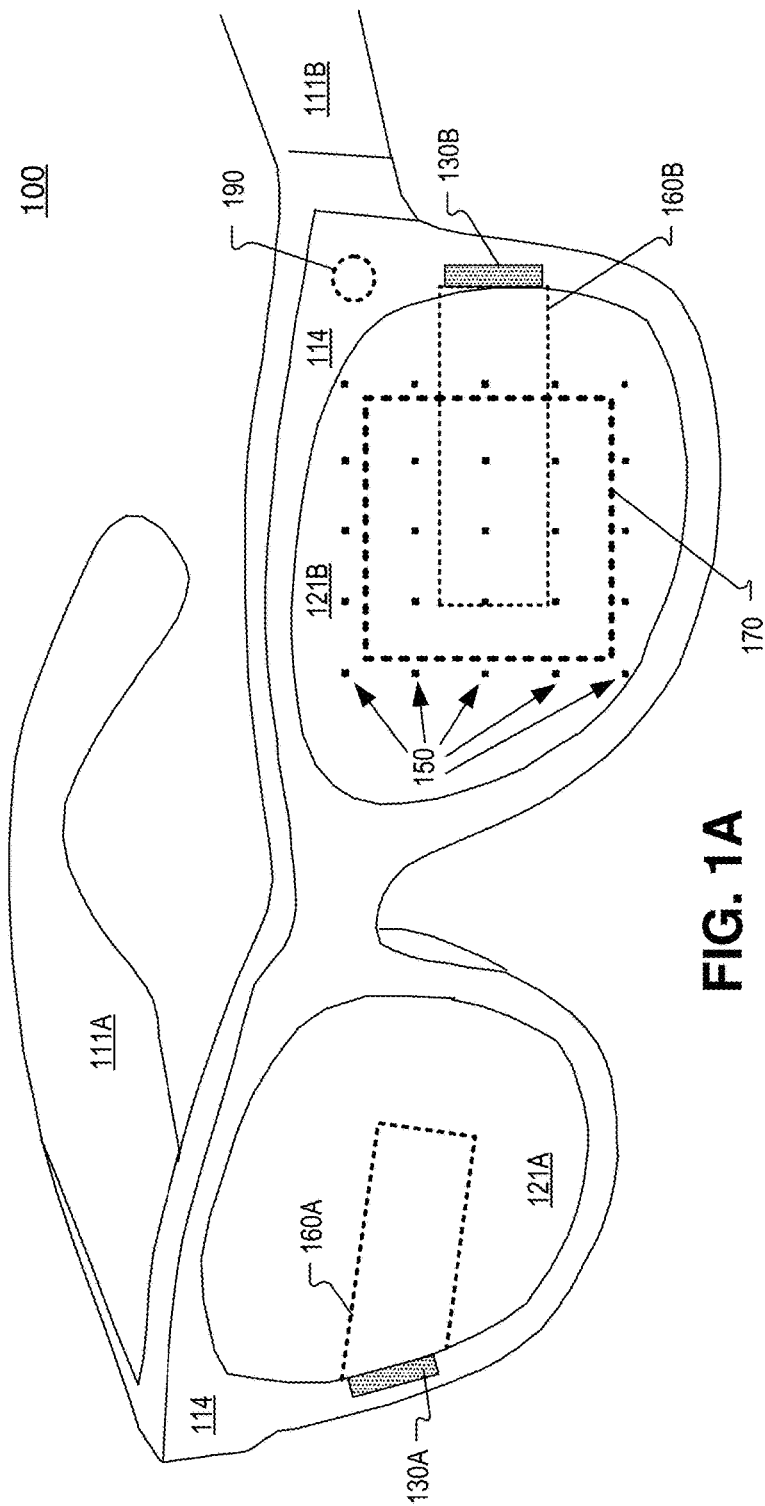
FIGS. 1A-1B illustrate an example head mounted display (HMD) that includes an array of light sources, such as VCSELs, emitting infrared light in an eyebox direction, in accordance with aspects of the disclosure.

FIG. 1A illustrates an example head mounted display (HMD) 100 that includes an array of light sources, such as VCSELs, emitting infrared light in an eyebox direction, in accordance with an embodiment of the disclosure. HMD 100 includes frame 114 coupled to arms 111A and 111B. Lenses 121A and 121B are mounted to frame 114. Lenses 121 may be prescription lenses matched to a particular wearer of HMD or non-prescription lenses. The illustrated HMD 100 is configured to be worn on or about a head of a user of the HMD.

In FIG. 1A, each lens 121 includes a waveguide 160 to direct image light generated by a display 130 to an eyebox area for viewing by a wearer of HMD 100. Display 130 may include an LCD, an organic light emitting diode (OLED) display, micro-LED display, quantum dot display, picoprojector, or liquid crystal on silicon (LCOS) display for directing image light to a wearer of HMD 100.

The frame 114 and arms 111 of the HMD may include supporting hardware of HMD 100. HMD 100 may include any of processing logic, wired and/or wireless data interface for sending and receiving data, graphic processors, and one or more memories for storing data and computer-executable instructions. In one embodiment, HMD 100 may be configured to receive wired power. In one embodiment, HMD 100 is configured to be powered by one or more batteries. In one embodiment, HMD 100 may be configured to receive wired data including video data via a wired communication channel. In one embodiment, HMD 100 is configured to receive wireless data including video data via a wireless communication channel.

Lenses 121 may appear transparent to a user to facilitate augmented reality or mixed reality where a user can view scene light from the environment around her while also receiving image light directed to her eye(s) by waveguide(s) 160. Lenses 121 may include an optical combiner 170 for directing reflected infrared light (emitted by light sources 150) to an eye-tracking camera (e.g. camera 190). Those skilled in the art understand that the array of light sources 150 on a transparent substrate could also be included advantageously in a VR headset where the transparent nature of the optical structure allows a user to view a display in the VR headset. In some embodiments of FIG. 1A, image light is only directed into one eye of the wearer of HMD 100. In an embodiment, both displays 130A and 130B are included to direct image light into waveguides 160A and 160B, respectively. The term VCSEL is used throughout this disclosure as an example of a light source in general, although those skilled in the art appreciate that in some embodiments, other light sources may be used instead of the specifically described VCSELs. For the purposes of this disclosure, the term "light source" may include a light emitting diode ("LED"), a VCSEL, or a resonant-cavity LED.

Lens 121B includes an array of VCSELs 150 arranged in an example 5×5 array. The VCSELs 150 in the array may not be evenly spaced, in some embodiments. VCSELs 150 may be infrared light sources directing their emitted light in an eyeward direction to an eyebox area of a wearer of HMD 100. VCSELs 150 may emit near-infrared light having a wavelength of 850 nm or 940 nm, for example. Very small metal traces or transparent conductive layers (e.g. indium tin oxide) may run through lens 121B to facilitate selective illumination of each VCSEL 150. Lens 121A may be configured similarly to the illustrated lens 121B.

While VCSELs 150 may introduce occlusions into an optical system included in an HMD 100, VCSELs 150 and corresponding routing may be so small as to be unnoticeable or optically insignificant to a wearer of an HMD. Additionally, any occlusion from VCSELs 150 will be placed so close to the eye as to be unfocusable by the human eye and therefore assist in the VCSELs 150 being not noticeable. In addition to a wearer of HMD 100 noticing VCSELs 150, it may be preferable for an outside observer of HMD 100 to not notice VCSELs 150.

Figure 1B:
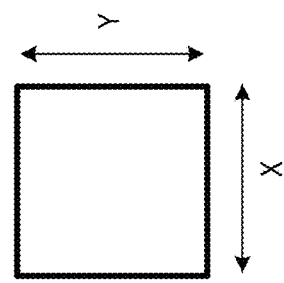

FIG. 1B illustrates a footprint of a VCSEL in accordance with embodiments of the disclosure. In some embodiments, each VCSEL 150 has a footprint where the "x" dimension is less than 100 microns and the "y" dimension is less than 100 microns. In some embodiments, each VCSEL 150 has a footprint where the "x" dimension is less than 75 microns and the "y" dimension is less than 75 microns. At these dimensions, the VCSELs 150 may not only be unnoticeable to a wearer of an HMD 100, the VCSELs 150 may be unnoticeable to an outside observer of HMD 100. VCSELs having "x" and "y" dimensions between 5 microns and 500 microns may be used.

Figure 2:
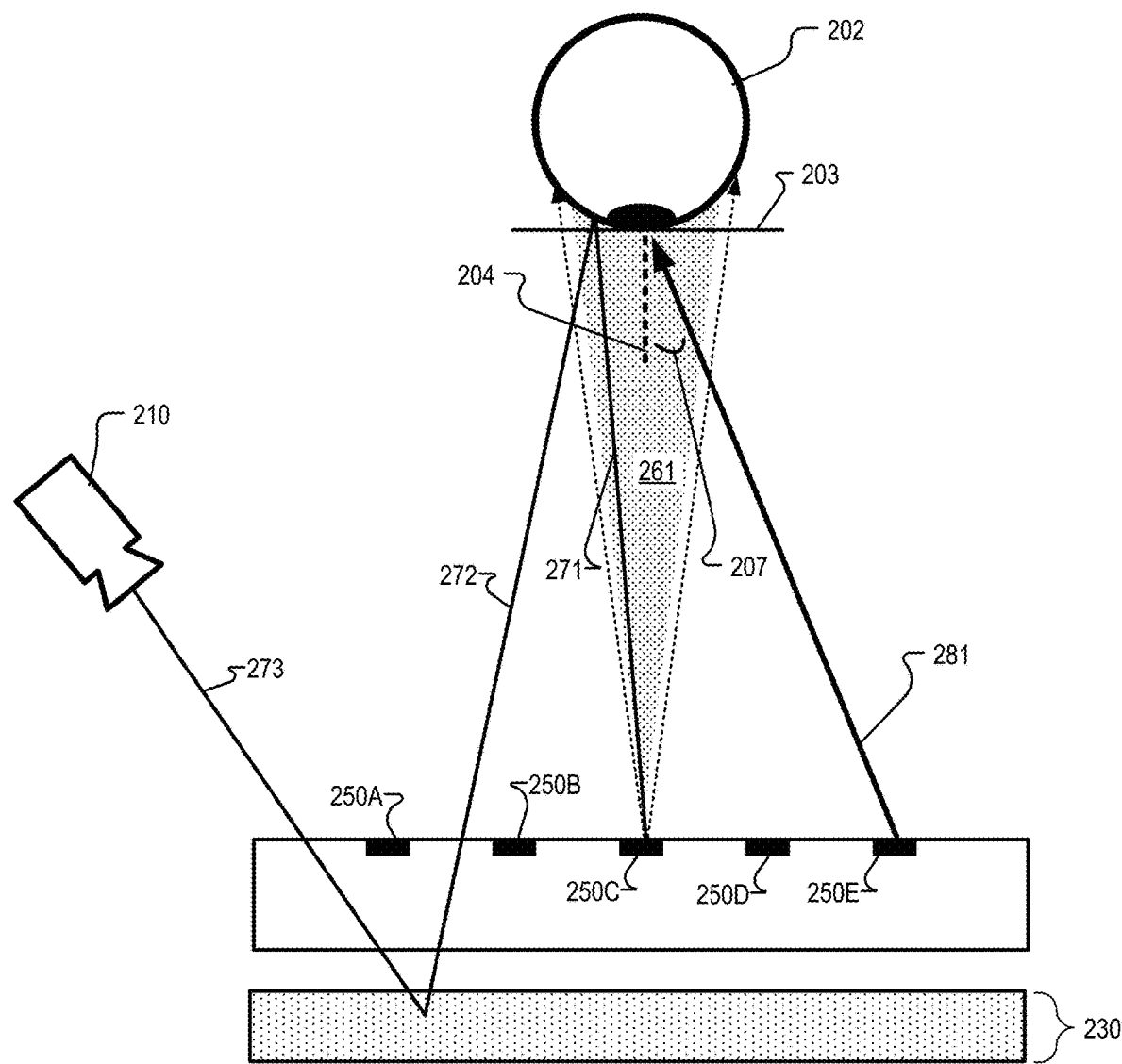
FIG. 2 illustrates a system that includes a side view of an array of VCSELs illuminating an eyebox area, in accordance with aspects of the disclosure.

FIG. 2 illustrates a system that 200 that includes a side view of an array of VCSELs 250 illuminating an eyebox area, in accordance with an embodiment of the disclosure. The array of VCSELs 250 includes VCSELs 250A, 250B, 250C, 250D, and 250E, in the illustrated embodiment. Of course, VCSELs 250A, 250B, 250C, 250D, and 250E, may be part of a larger array of VCSELs such as the twenty-five VCSELs 150 illustrated in FIG. 1. VCSEL 250C illuminates eye 202 with infrared beam 261. VCSELs 250A, 250B, 250D, and 250E may also illuminate eye 202 with infrared beams (not illustrated). Infrared light emitted by VCSEL 250C propagates along optical path 271 and reflects off of eye 202 propagating along optical path 272. The infrared light propagating along optical path 272 travels through a transparent substrate that houses the VCSELs 250 and encounters combiner 230. Combiner 230 directs the infrared light to camera 210 along optical path 273. Combiner 230 may include a polarized volume hologram (PVH), a volume Bragg grating, a hologram, a wavelength selective reflective grating, and/or metalenses, in some embodiments. Combiner 230 may include a Fresnel structure or a distributed array of reflective mirrors that selectively reflect only some portions of the light based on wavelengths or polarization, in some embodiments.

Therefore, system 200 shows how VCSELs 250 may illuminate eye 202 with infrared light and shows how camera 210 may capture infrared images of eye 202 by capturing the infrared light. In some embodiments, camera 210 may be configured with a bandpass filter that accepts a narrow-band infrared light that is the same as the narrow-band emitted by VCSELs 250 while the filter rejects other wavelengths. For example, VCSELs 250 may emit narrow-band infrared light centered around 940 nm while camera 210 may include a filter that accepts/transmits infrared light centered around 940 nm while rejecting/blocking other light wavelengths.

Figure 6:
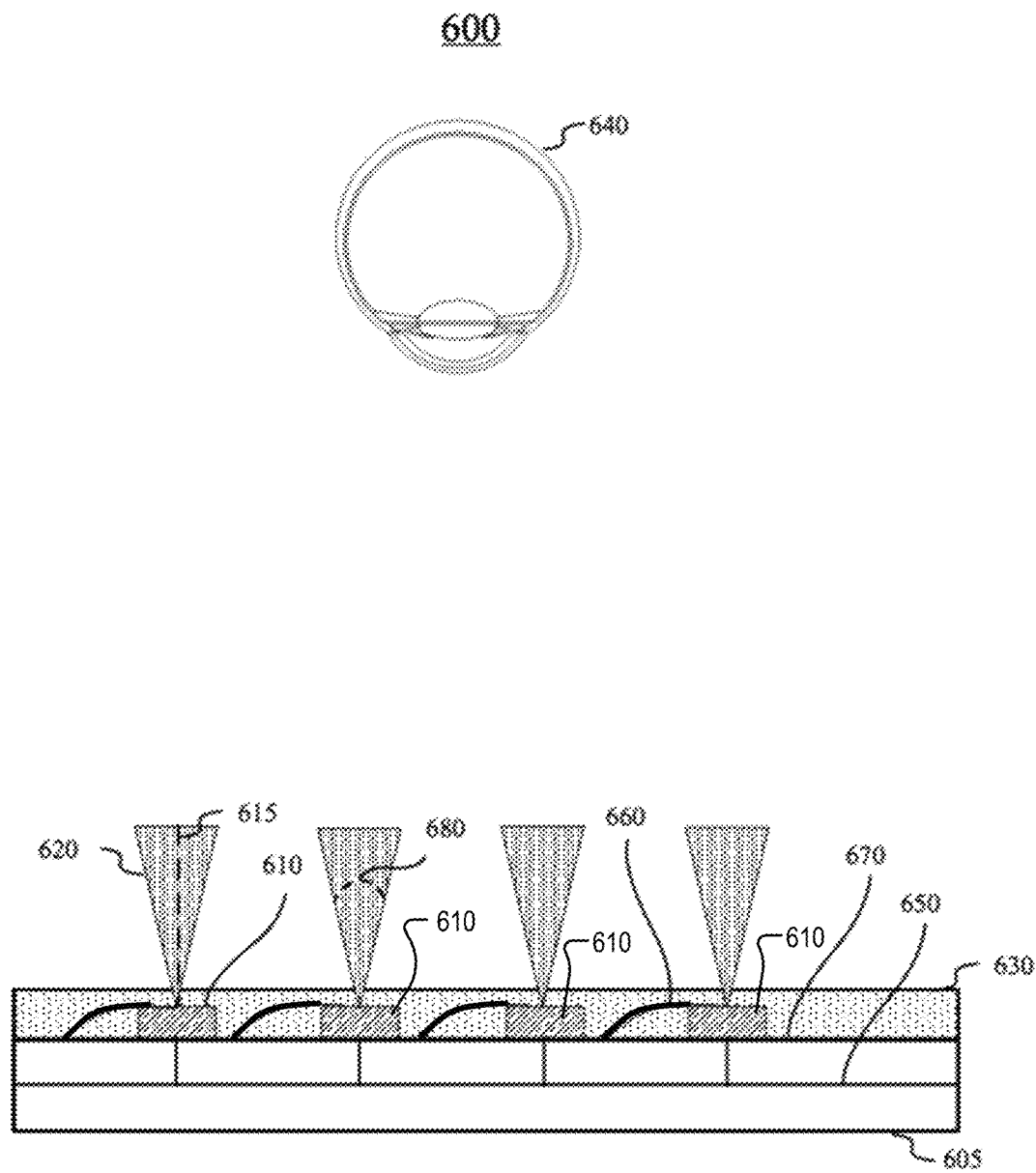
FIG. 6 is a simplified diagram illustrating an example illuminator for eye tracking in an example near-eye display, in accordance with aspects of the disclosure.

FIG. 6 is a simplified diagram illustrating an example illuminator 600 for eye tracking in an example near-eye display, according to certain embodiments. FIG. 6 is merely illustrative and is not drawn to scale. Illuminator 600 may include a substrate 605 positioned in front of (e.g., at a distance of about 10-35 mm from) a user's eye 640 and within the field of view of user's eye 640. Substrate 605 may include one or more types of dielectric materials, such as glass, quartz, sapphire, plastic, polymer, PMMA, crystal, or ceramic, and may be transparent to, for example, both visible light and near-infrared (NIR) light. In some implementations, substrate 605 may be a part of glasses of the near-eye display or a part of display optics described above. Substrate 605 may have a thickness less than about 10 mm, and may have any suitable shape, such as cuboidal, or may have a curved surface. For example, a surface 670 of substrate 605 may be flat or curved. Further, some or all of substrate 605 may be coated with a conductive material that may or may not be transparent to visible light. The conductive material may include any suitable conductor, such as graphene or a transparent conductive oxide such as indium tin oxide (ITO).

As shown in FIG. 6, a plurality of VCSELs 610 may be mounted on substrate 605. VCSELs 610 may be attached to substrate 605 in any suitable manner, such as bonding, gluing, or soldering. For example, VCSELs 610 may be die-bonded to substrate 605 using metal-loaded conductive adhesives. Further, VCSELs 610 may be wire-bonded to a conductive coating on surface 670 of substrate 605 via wire 660. Although FIG. 6 illustrates a wire bond configuration, implementations of the disclosure may also include flip chip configurations. In addition, electrodes of VCSELs 610 may be electrically connected to a conductive circuit trace 650 within substrate 605. Conductive circuit trace 650 may be used to control the activity of VCSELs 610. Although a plurality of VCSELs 610 are shown in FIG. 6, other embodiments of the illuminator 600 may have a single VCSEL 610. Further, the plurality of VCSELs 610 may be arranged in a one-dimensional line or a two-dimensional array.

Each VCSEL 610 emits light having an emission cone 620 whose axis is normal to a top surface of the VCSEL 610, in FIG. 6. For example, each VCSEL 610 may be a VCSEL having an emission cone 620 with an angle 680 of up to 50°. VCSELs 610 may be surrounded by or immersed in an encapsulation layer 630 that is an index matched layer, such that a refractive index of encapsulation layer 630 matches a refractive index of substrate 605. In some embodiments, encapsulation layer 630 is not necessarily index matched to substrate 605. Encapsulation layer 630 may protect VCSELs 610 from damage.

As shown in FIG. 6, an axis 615 of each emission cone 620 is normal to the top surface of VCSEL 610 and substrate 605. As a result, light from some VCSELs 610 may not be angled directly toward eye 640. This may cause some or all of the light from VCSELs 610 to be wasted by not reaching eye 640. This may be especially problematic for VCSELs 610 that are positioned near the outer edges of substrate 605, due to the relatively narrow angle 680 of emission cone 620. Some embodiments may address this issue by making surface 670 of substrate 605 curved. However, it may be difficult to bond VCSELs 610 on a curved surface.

Figure 7:
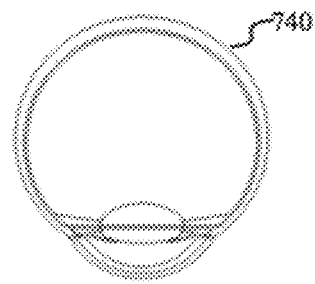
FIG. 7 is a simplified diagram illustrating an example illuminator for eye tracking in an example near-eye display, in accordance with aspects of the disclosure.
Figure 7:
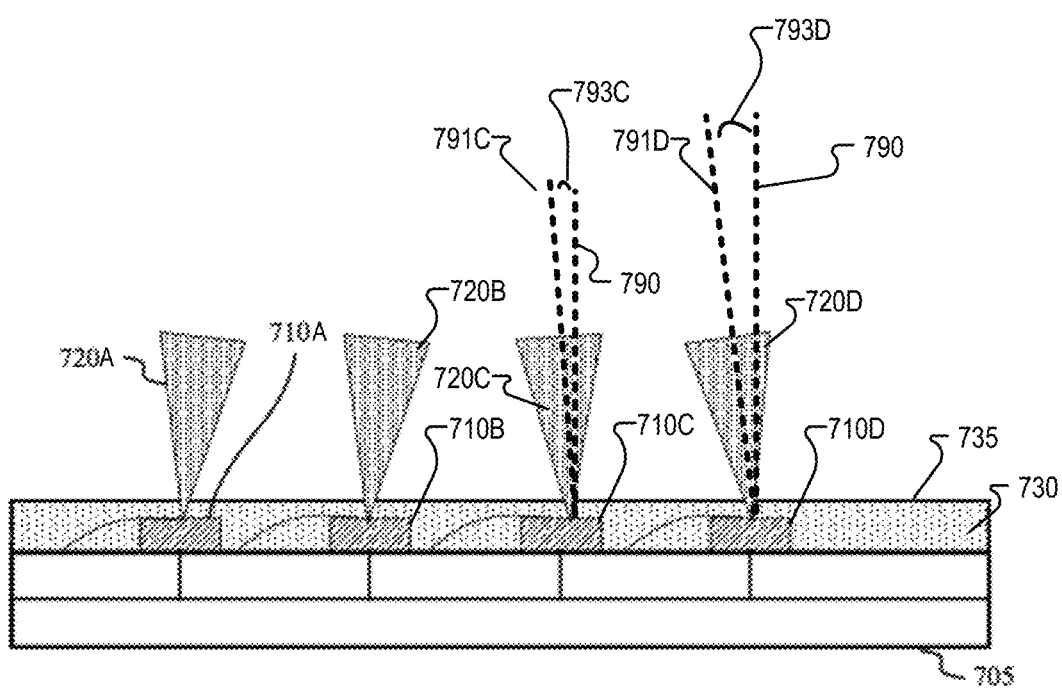

FIG. 7 is a simplified diagram illustrating an example illuminator 700 for eye tracking in an example near-eye display, according to certain embodiments. FIG. 7 is merely illustrative and is not drawn to scale. The elements shown in FIG. 7 are similar to those shown in FIG. 6, except that each VCSEL 710 is provided with a beam diverting component (not shown in FIG. 7) that directs light from the VCSEL 710 toward eye 740. The beam diverting components for VCSELs 710 near the outer edges of substrate 705 may be configured to bend the light at a larger tilt angle, in order to direct the light toward eye 740. Alternatively, some or all of the beam diverting components may bend the light at the same angle, such as an array of light sources that are arranged in a circle whose center is aligned with a center of eye 740. The beam diverting components are further described below with respect to FIGS. 8A-8E.

The distribution of the light emitted from VCSELs 710 and directed by the beam diverting components toward eye 740 may be controlled by the beam diverting components. For example, each beam diverting component may direct the light from a respective VCSEL 710 in a different direction and may illuminate a different area on eye 740, depending on the location of VCSEL 710 and the angle at which the beam diverting component bends the light. For example, as discussed above, the beam diverting components for VCSELs 710 (e.g. VCSEL 710A and 710D) near the outer edges of substrate 705 may be configured to bend the light at a larger angle so the tilt angle of the emission is larger near the outer edges, while the beam diverting components for VCSELs 710 (e.g. VCSEL 710B and 710C) near the middle of substrate 705 (i.e., closest to a normal vector of eye 740) may be configured to bend the light at a smaller tilt angle. Further, each area of eye 740 may be illuminated approximately uniformly by VCSELs 710. Using multiple VCSELs 710 may allow multiple glints to be generated, which may improve eye-tracking accuracy. FIG. 7 illustrates that the tilt angle of an emission cone 720 may be defined as the angle 793 between an orthogonal axis 790 and a primary emission axis 791 of a given emission cone 720. Orthogonal axis 790 may be orthogonal to a surface 735 of encapsulation layer 730, in some examples. The primary emission axis 791 runs through the angle of peak light intensity for the given emission cone 720, in some examples. In one example, primary emission axis 791 is defined by a light ray running through the geometric center of a given emission cone 720. In the example of FIG. 7, emission cone 720D has a larger tilt angle 793D than the tilt angle 793C of emission cone 720C because the primary emission axis 791D has a larger offset from orthogonal axis 790 than primary emission axis 791C being offset from orthogonal axis 790. Consequently, emission cone 720D of VCSEL 710D is directed to illuminate eye 740 at the appropriate tilt angle 793D and emission cone 720C of VCSEL 710C is directed to illuminate eye 740 at the appropriate tilt angle 793C.

FIGS. 8A-8E are simplified diagrams illustrating example illuminators for eye tracking having various beam diverting components, according to certain embodiments. FIGS. 8A-8E are merely illustrative and are not drawn to scale. As shown in FIGS. 8A-8E, a VCSEL 810 having an emission area 815 is mounted on a substrate 805. Beam diverting components 880, 885, 890, 896, 897, and 898 may change the direction of light from emission area 815. Additionally, the beam diverting components may generate different divergence angles for different VCSELs. VCSEL 810 may be configured such that emission area 815 emits light normal to substrate 805. However, beam diverting components may change the direction of the light, such that the light is directed toward an eye of the user. For example, beam diverting components 880, 885, 890, 896, 897, and 898 may bend the light such that at least a portion of the light is incident on the eye at an angle with respect to a plane (e.g. plane 203) that is normal to a surface of the eye. As discussed above, the angle may be selected such that at least some of the light is reflected by the eye and is incident on the camera by way of optical paths 272 and 273, for example. Alternatively, beam diverting components 880, 885, 890, 896, 897, and 898 may bend the light such that more of the light is incident on the surface of the eye.

FIG. 8A illustrates an example illuminator for eye tracking having beam diverting component 880 that is a microprism, according to certain embodiments. A shape and a position of the micro-prism may be adjusted to customize the tilt angle at which the light from emission area 815 is bent. The micro-prism may be incorporated into the illuminator and aligned with VCSEL 810 by any suitable method. For example, the micro-prism or an array of micro-prisms may be molded from a substrate, and then the micro-prism may be placed on VCSEL 810 and aligned with emission area 815. Further, the micro-prism may be patterned into a substrate by grayscale lithography or photolithography or replication or imprinting or molding or diamond turning or some other method. A micro-prism or refractive lens may also be etched into a high index refractive material such as gallium-arsenide ("GaAs"). The gallium-arsenide layer that is etched into a micro-prism or lens may have been grown on top of a VCSEL, or in the case of a flip chip configuration, a lens may be etched into the VCSEL substrate. The micro-prism may also be deposited on VCSEL 810 by pick-and-place deposition.

FIG. 8B illustrates an example illuminator for eye tracking having beam diverting component 885 that is an off-axis micro-lens, according to certain embodiments. A shape and a position of the micro-lens may be adjusted to customize the tilt angle at which the light from emission area 815 is bent. The micro-lens may be incorporated into the illuminator and aligned with VCSEL 810 by any suitable method. For example, the micro-lens or an array of micro-lenses may be molded from a substrate, and then the micro-lens may be placed on VCSEL 810 such that an optical axis of the micro-lens is offset from an optical axis of emission area 815. In addition, the micro-lens may be formed by three-dimensional (3D) direct write lithography, injection molding, or inkjet printing or molding or imprinting or casting or replication or 3D printing or diamond turning. A flat metalens may be formed by nanoimprinting or optical lithography. Further, the micro-lens may be deposited on VCSEL 810 by inkjet printing. The micro-lens may also be deposited on VCSEL 810 by pick-and-place deposition.

FIG. 8C illustrates an example illuminator for eye tracking having beam diverting component 890 that is an inverse micro-prism, according to certain embodiments. A shape and a position of the inverse micro-prism may be adjusted to customize the tilt angle at which the light from emission area 815 is bent. The inverse micro-prism may be incorporated into the illuminator and aligned with VCSEL 810 by any suitable method. For example, the inverse micro-prism may be patterned into a substrate by grayscale lithography or photolithography, and may then be placed on VCSEL 810 and aligned with emission area 815. Further, the inverse micro-prism may be formed by injection molding. In addition, the inverse micro-prism may be formed by diamond turning in an encapsulation layer that surrounds VCSEL 810. The inverse micro-prism may also be deposited on VCSEL 810 by pick-and-place deposition. For the illuminators shown in FIGS. 8A, 8B, and 8C, the VCSELs 810 and beam diverting components 880, 885, and 890 may be immersed in an encapsulant (not shown), where the encapsulant may have a different refractive index than the beam diverting components 880, 885, and 890.

Figure 8E:
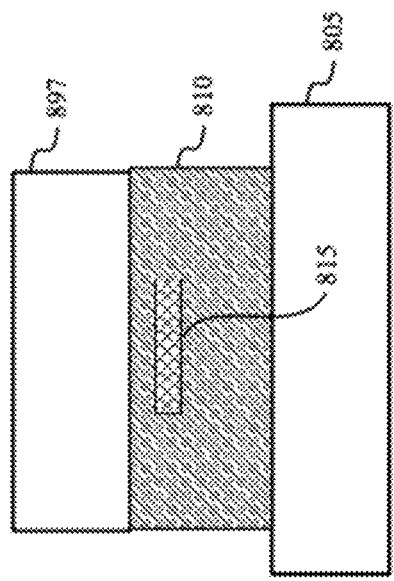
Figure 8F:
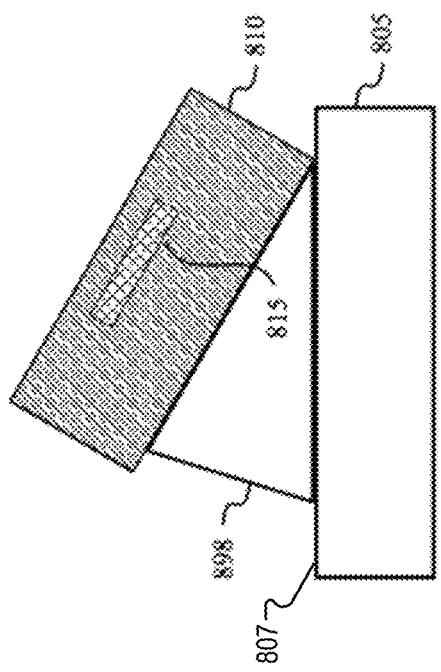
Figure 8D:
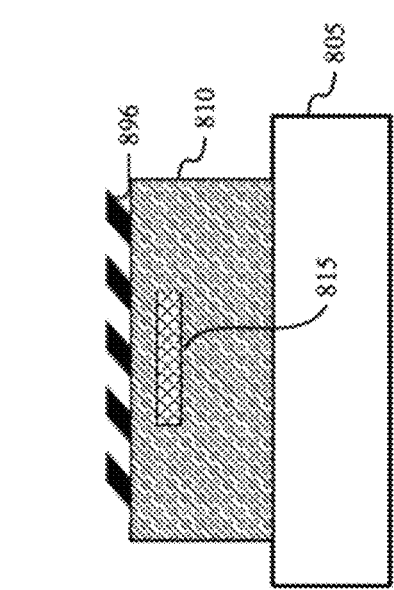

FIGS. 8D and 8E illustrate example illuminators for eye tracking having beam diverting components 896 and 897, respectively, that are gratings, according to certain embodiments. A period, slant angle, material(s), shape, and/or position of the grating may be adjusted to customize the tilt angle at which the light from emission area 815 is bent. For example, a shorter grating period diffracts light at a larger tilt angle and may be used on the outer edges of the grating. Slanted gratings increase the amount of light diffracted in the −1 or +1 diffraction order. The grating may be incorporated into the illuminator and aligned with VCSEL 810 by any suitable method. For example, the grating may be formed in a substrate by etching and nanoimprinting, or by holography or replication. Further, as shown in FIG. 8D, the grating may be a surface relief grating (SRG) 896 that is formed by direct imprinting on a surface of VCSEL 810. In addition, the grating may be fabricated as a roll that forms an encapsulation layer on VCSEL 810. The grating may also be a thin phase hologram of a thick volume Bragg grating 897, as shown in FIG. 8E.

FIG. 8F illustrates an example illuminator for eye tracking having beam diverting component 898 that is an inclined plane, according to certain embodiments. A shape and a position of the inclined plane may be adjusted to customize the tilt angle at which the light from emission area 815 is bent. The inclined plane may be incorporated into the illuminator and aligned with VCSEL 810 by any suitable method. For example, grayscale lithography may be used to pattern small bumps on a bottom surface of VCSEL 810, such that a coefficient of friction is sufficient to prevent VCSEL 810 from sliding off of the inclined plane. Alternatively, VCSEL 810 may be mounted with solder bumps, where the bonding pads have different thicknesses, different amounts of solder are used, and/or VCSEL 810 is held at a predetermined angle that is not parallel with the bonded surface 807 of substrate 805.

Figure 3A:
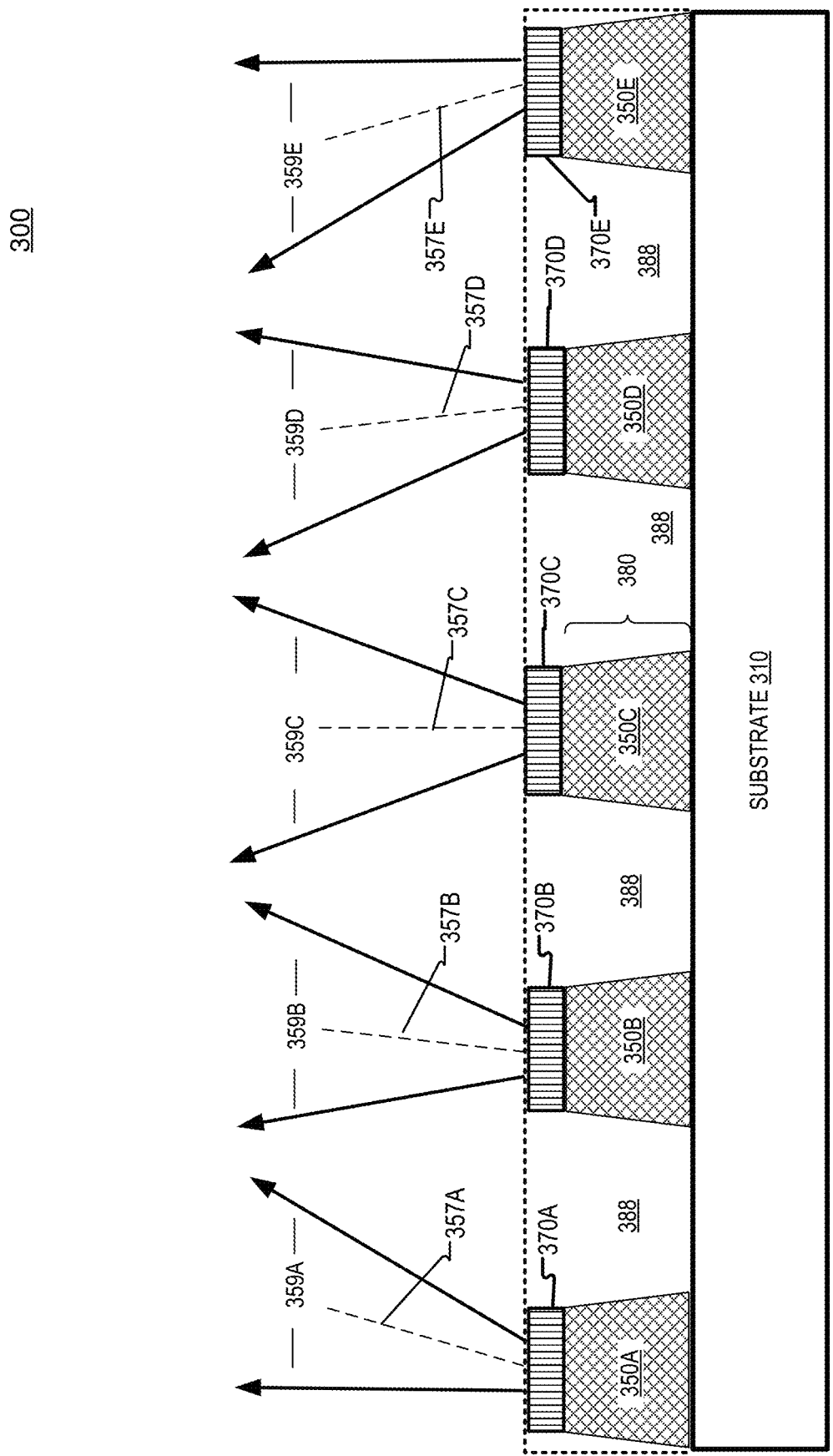
FIG. 3A illustrates an example structure including a plurality of VCSELs, in accordance with aspects of the disclosure.

FIG. 3A illustrates an example structure 300 including a plurality of VCSELs 350. The plurality of VCSELs 350 are configured to emit narrow-band infrared light through their emission apertures. VCSEL optics 370 are formed over the emission apertures of the plurality of VCSELs and the VCSEL optics 370 may provide different divergence angles to the narrow-band infrared light emitted by the VCSELs 350. VCSEL optics 370 may also provide different tilt angles for the emitted infrared light. In one embodiment, the tilt angle of a given VCSEL is defined as the average emission angle of the emitted infrared beam relative to a vector normal to the substrate at the given VCSEL. In one embodiment, the tilt angle of a given VCSEL is defined as the average emission angle of the emitted infrared beam relative to a vector normal to the substrate of a designated VCSEL. For example, the tilt angle of beam 359C may be approximately zero where vector 357C (vector 357C being normal to the substrate 310 at VCSEL 350C) illustrates the average emission angle of beam 359C is approximately zero. The tilt angle of beam 359E illustrated by vector 357E may be 20 degrees tilted with respect to vector 357C. Or the tilt angle of beam 359E illustrated by vector 357E may be 20 degrees tilted with respect to a vector (not illustrated) that is normal to substrate 310 at the position of VCSEL 350E. These tilt angles may be different when substrate 310 is not planar, for example.

Structure 300 shows that VCSELs 350 are disposed on substrate 310. In some embodiments, substrate 310 is an optically transparent substrate such as glass or plastic and incorporated into lens 121, for example. Structure 300 illustrates an enclosing layer 388 that may be disposed between VCSELs 350.

The VCSEL optics 370 may include the characteristics of the embodiments of beam diverting components 880, 885, 890, 896, 897, and 898, for example. VCSEL optics 370 may decrease their divergence angles as the VCSELs optics 370 get closer to a boundary of the substrate. For example, the divergence angle associated with beam 359A may be smaller than the divergence angle associated with beam 359B, which may be smaller than the divergence angle associated with beam 359C. And, the divergence angle associated with beam 359E may be smaller than the divergence angle associated with beam 359D, which may be smaller than the divergence angle associated with beam 359C. The divergence angle of beam 359C may be 60 degrees in some embodiments. In one embodiment, the VCSEL optics 370 may increase their divergence angles as the VCSEL optics 370 get closer to a boundary of the substrate.

VCSEL optics 370 may increase a tilt angle of the VCSEL optic as the VCSEL optics get closer to a boundary of the substrate. For example, the tilt angle associated with vector 357A of beam 359A may be larger than the tilt angle associated with vector 357B of beam 359B, which may be larger than the tilt angle associated with a vector 357C of beam 359C. And, the tilt angle associated with a vector 357E of beam 359E may be larger than the tilt angle associated with vector 357D of beam 359D, which may be larger than the tilt angle associated with vector 357C of beam 359C. The tilt angle of beam 359C may be approximately zero degrees.

Figure 3B:
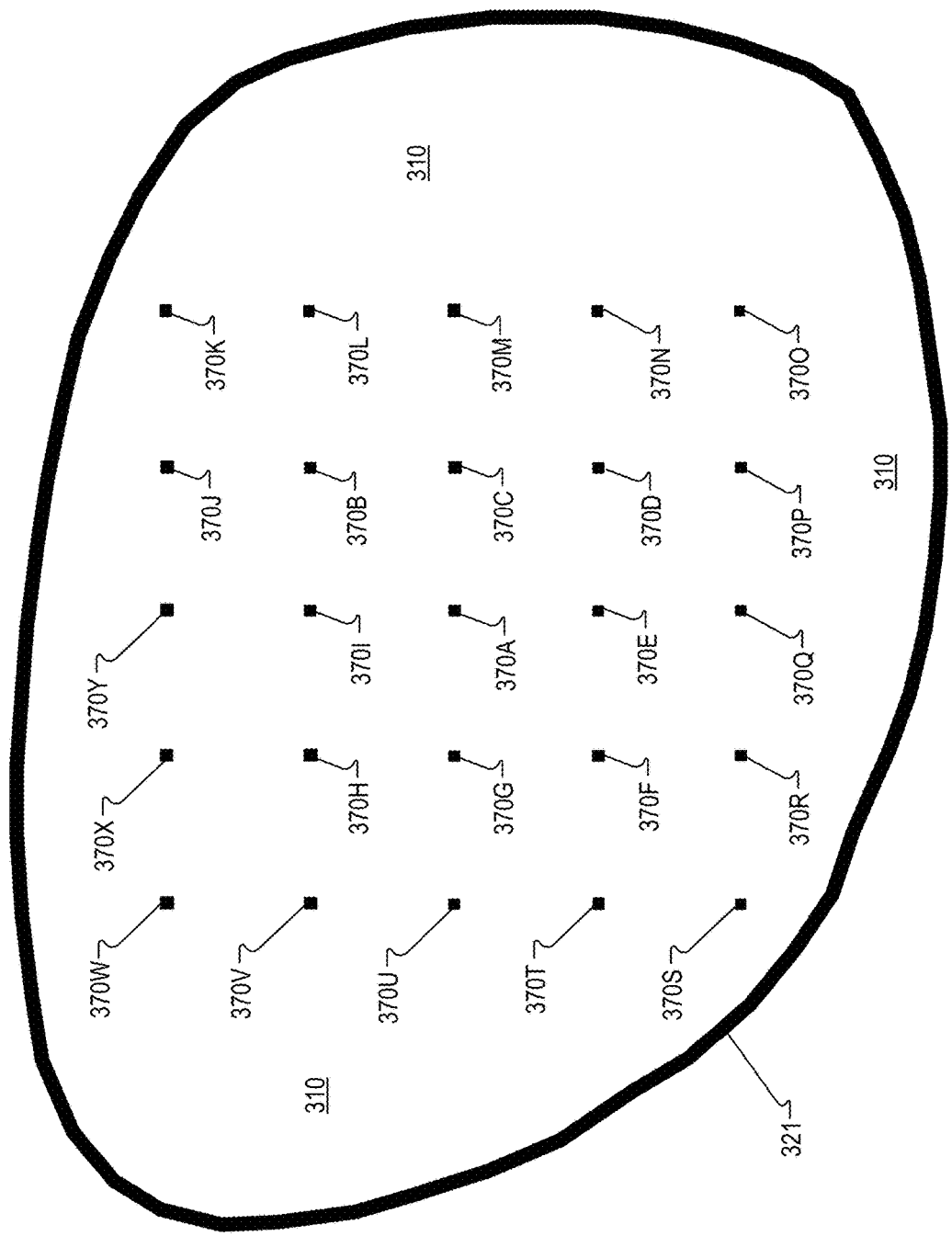
FIG. 3B illustrates a lens that includes a transparent substrate with an example 5×5 array of VCSELs, in accordance with aspects of the disclosure.

FIG. 3B illustrates a lens 321 that includes a transparent substrate 310 with an example 5×5 array of VCSELs having VCSEL optics 370A-Y. VCSEL optics 370J-Y may be configured to provide larger tilt angles to the VCSELs they are disposed on since they may be farther from a center of an eye. VCSEL optics 370B-I may be configured to provide tilt angles to the VCSELs they are disposed on that are less than the tilt angles of VCSEL optics 370J-Y. VCSEL optic 370A may be configured to provide a tilt angle to the VCSEL it is disposed over of zero degrees or a tilt angle that is less than the tilt angles provided by VCSEL optics 370B-I.

Figure 9B:
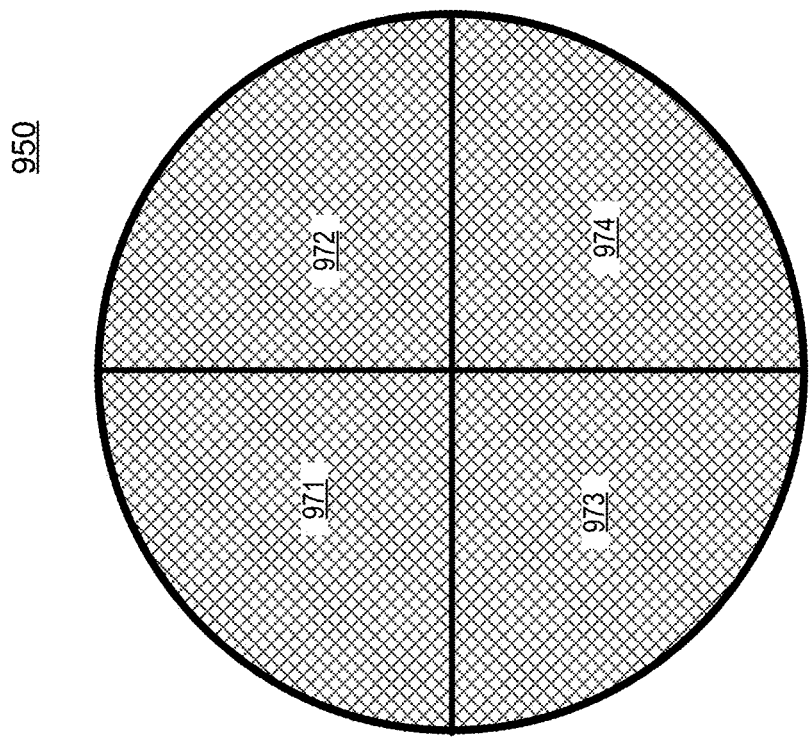
FIGS. 9A-9B illustrate example wafers having wafer level optics, in accordance with aspects of the disclosure.
Figure 9A:
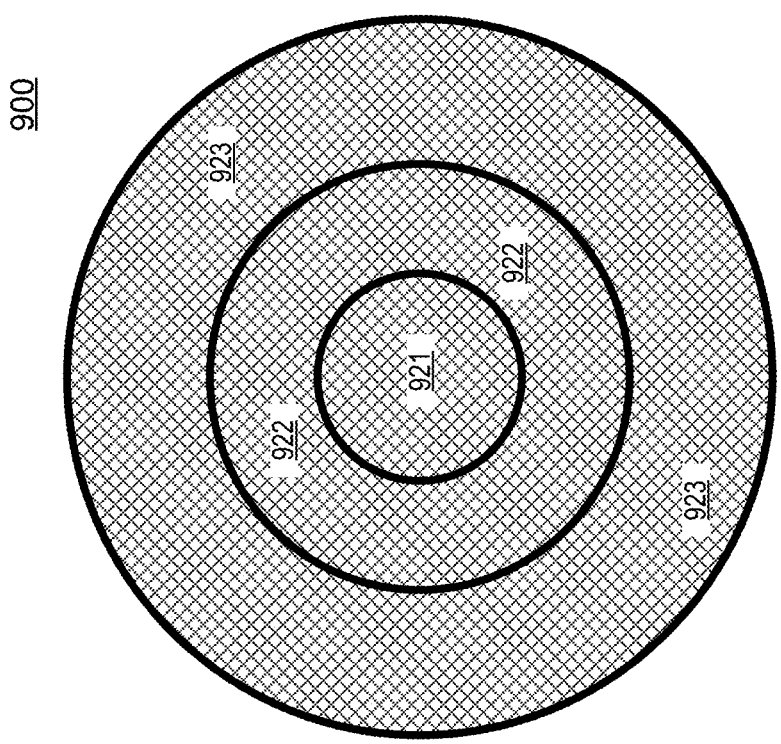

Fabricating VCSELs with different VCSEL optics that provide different tilt angles and/or different divergence angles (to provide different beam shapes) may be created by fabricating a VCSEL wafer that includes a plurality of VCSELs that have different VCSEL optics 370 in different zones of the VCSEL wafer. FIG. 9A illustrates a VCSEL wafer 900 having first Wafer Level Optics (WLO) on a first zone 921 of VCSEL mesas, second WLOs on a second zone 922 of VCSEL mesas, and third WLOs on a third zone 923 of VCSEL mesas. FIG. 9B illustrates another example VCSEL wafer 950 having first Wafer Level Optics (WLO) on a first zone 971 of VCSEL mesas, second WLOs on a second zone 972 of VCSEL mesas, third WLOs on a third zone 973 of VCSEL mesas, and fourth WLOs on a fourth zone 974 of VCSEL mesas. The WLO on the different zones may be configured to provide different tilt angles and different beam shaping (e.g. divergence angles). A pick-and-place machine may then select, VCSELs with their corresponding WLO attached to the VCSEL that have different tilt angle and divergence angles where the VCSELs were grown on the same wafer. Although FIG. 9A illustrate three zones 921, 922, and 923 and FIG. 9B illustrates four zones 971, 972, 973, 974, it is appreciated by those skilled in the art that any number of zones of a VCSEL corresponding to different VCSEL optics may be utilized. In one embodiment, a VCSEL wafer may have 16 zones or 24 zones, for example.

Once a VCSEL is grown on a semiconductor substrate (e.g. GaAs) a replication or casting technique may be utilized to cast Wafer Level Optics that include refractive optics, surface relief gratings, catadioptric lenses, reflective lenses, and/or engineered diffusers, as VCSEL optics 370, for example. Fabricating the VCSELs 350 with VCSEL optics 370 may also include lithography (grayscale or binary) that includes applying a coating/layer on top of VCSELs 350. Fabricating VCSELs with VCSEL optics 370 may also include a modification of the illuminator window using lithography (grayscale or binary). Furthermore, in some implementations of the disclosure, a micro-prism or refractive lens may also be etched into gallium-arsenide or another high index material. The gallium-arsenide layer or other high index material that is etched into a micro-prism or lens may be grown on top of a VCSEL, or in the case of a flip chip configuration, a lens may be etched into the VCSEL substrate.

Figure 4C:
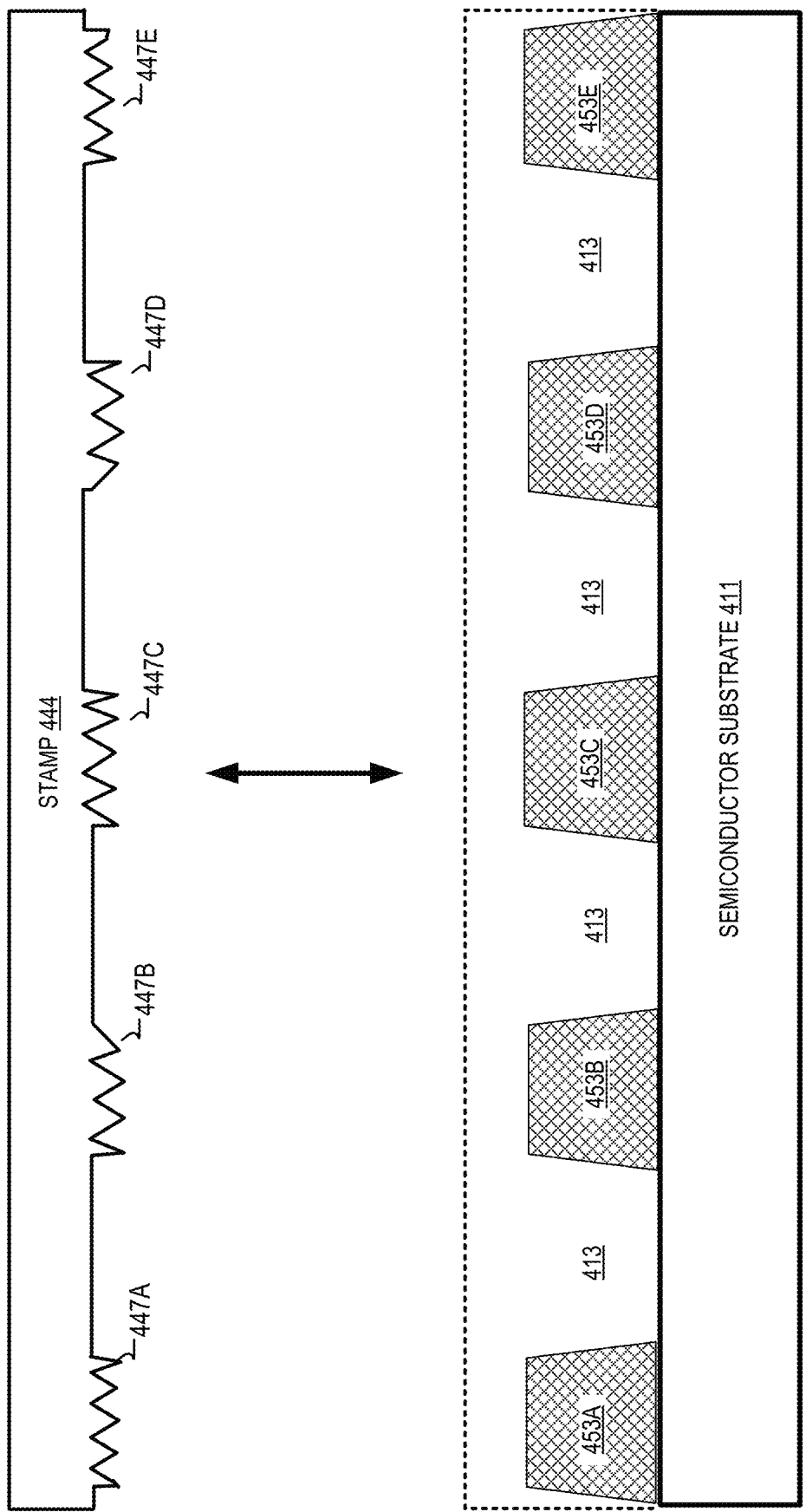
Figure 4D:
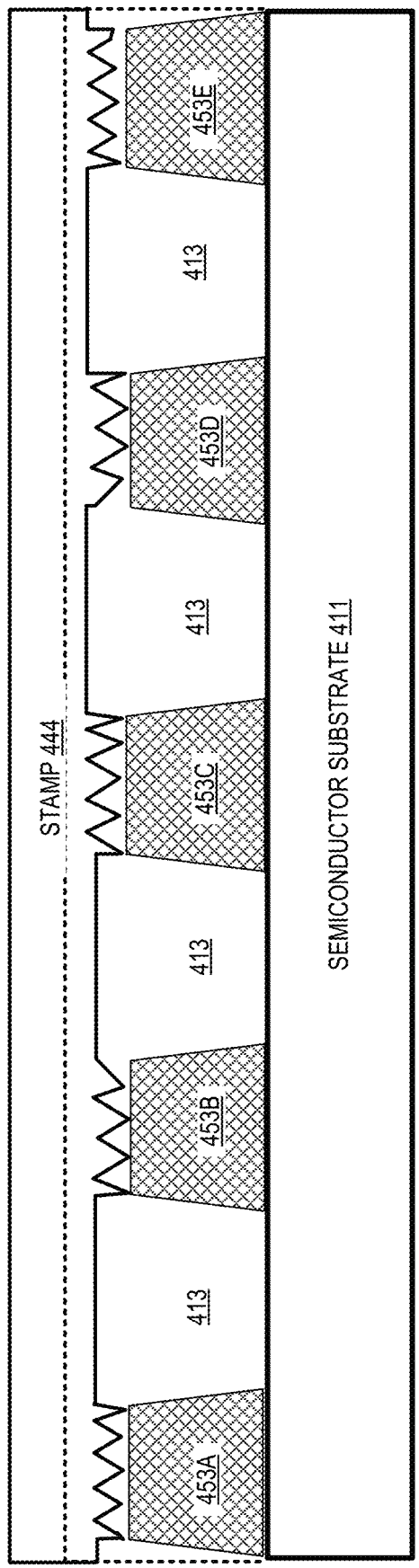
Figure 4E:
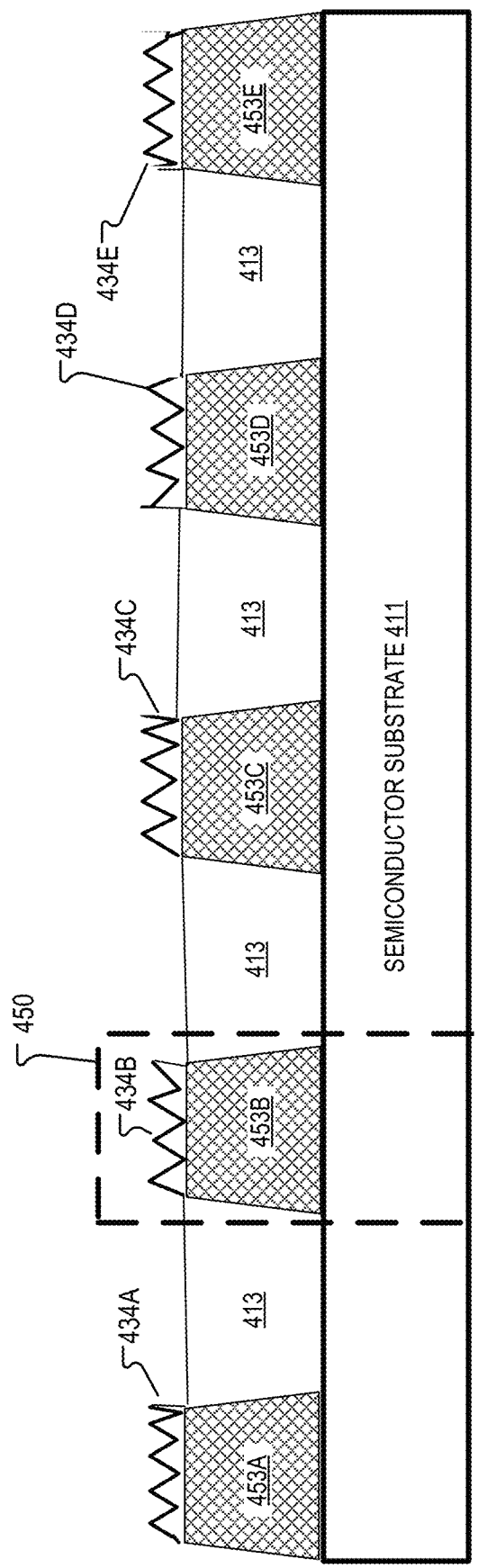

FIGS. 4A-4E illustrate an example wafer-level fabrication method of a placing WLOs having different tilt angles and/or different beam divergence angles on VCSELs on the same wafer. In FIG. 4A, a structure 400 is provided that includes VCSEL mesas 453A-E disposed on a semiconductor substrate 411. The semiconductor substrate may be GaAs, in some embodiments. FIG. 4B illustrates forming an optical encapsulant layer 413 onto a plurality of VCSEL mesas 453. FIGS. 4C and 4D illustrate pressing a stamp 444 into the encapsulant layer 413. The stamp 444 includes negatives 447 of the wafer level optics (WLO) aligned with the VCSEL mesas. The negatives 447 may be different and be aligned with VCSELs in different zones. For example, negatives 447A and 447E may be aligned with VCSELs in a first zone, negatives 447B and 447D may be aligned with VCSELs in a second zone, and negative 447C aligned with VCSEL(s) in a third zone. The different negatives may have different characteristics that form the VCSEL optics having different divergence angles and tilt angles, as described in FIG. 3A. After (or during) a curing of layer 413, the stamp may be removed to leave VCSEL optics 434, as in FIG. 4E. When the wafer is diced, structure 450 provides a VCSEL having a WLO that has the characteristics of optical structure 434B.

Figure 5A:
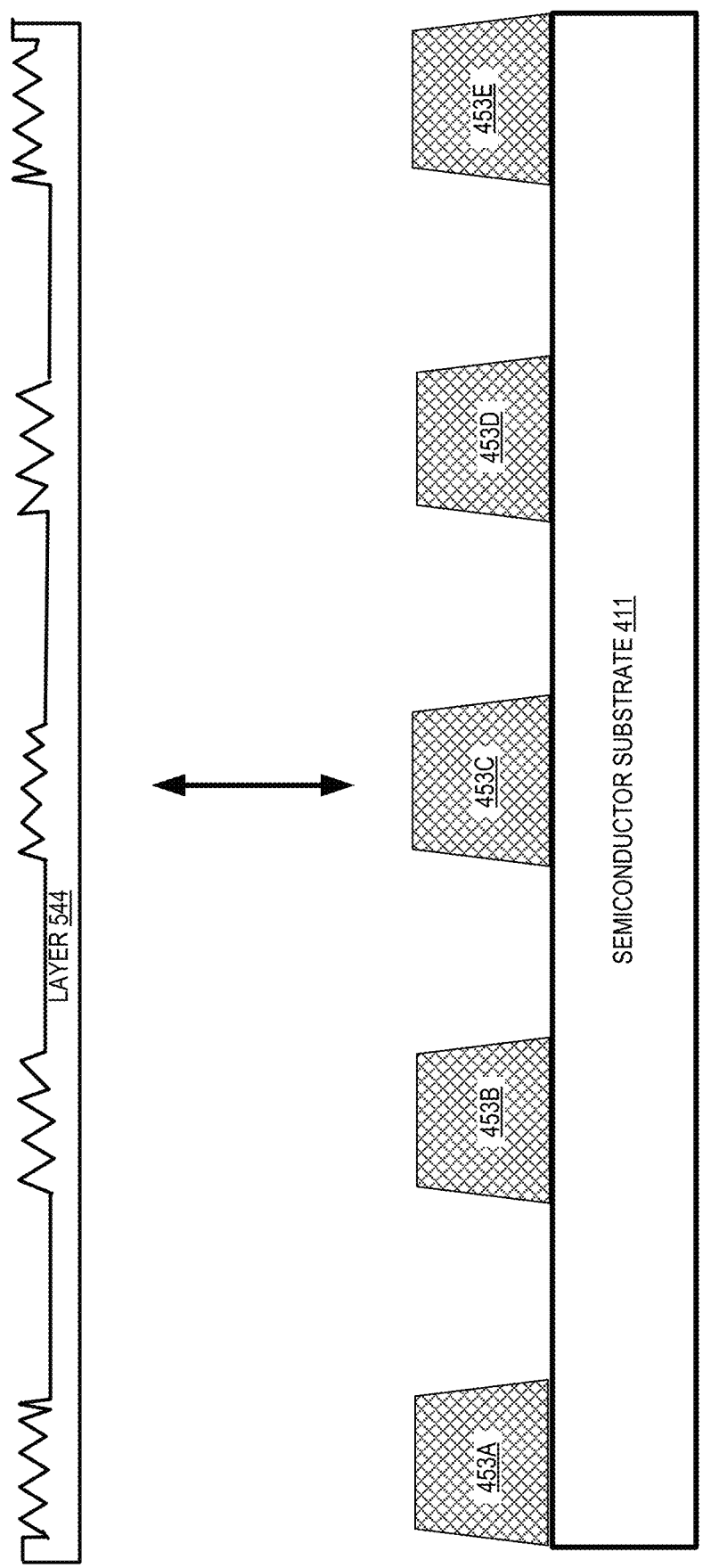

FIGS. 5A-5B illustrate an example wafer-level fabrication method of a placing WLOs having different tilt angles and/or different beam divergence angles on VCSELs on the same wafer. FIG. 5A illustrates wafer level optic layer 544 being aligned with the VCSEL mesas 453 and FIG. 5B illustrates the VCSEL optics 534 being disposed over their respective VCSEL mesa 453. Wafer Level Optic Layer 544 may be a rigid material and be bonded to the VCSELs 350 with an optical grade adhesive. When the wafer is diced, structure 550 provides a VCSEL having a WLO that has the characteristics of optical structure 534B.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The term "processing logic" in this disclosure may include one or more processors, microprocessors, multi-core processors, Application-specific integrated circuits (ASIC), and/or Field Programmable Gate Arrays (FPGAs) to execute operations disclosed herein. In some embodiments, memories (not illustrated) are integrated into the processing logic to store instructions to execute operations and/or store data. Processing logic may also include analog or digital circuitry to perform the operations in accordance with embodiments of the disclosure.

A "memory" or "memories" described in this disclosure may include one or more volatile or non-volatile memory architectures. The "memory" or "memories" may be removable and non-removable media implemented in any method or technology for storage of information such as computer-readable instructions, data structures, program modules, or other data. Example memory technologies may include RAM, ROM, EEPROM, flash memory, CD-ROM, digital versatile disks (DVD), high-definition multimedia/data storage disks, or other optical storage, magnetic cassettes, magnetic tape, magnetic disk storage or other magnetic storage devices, or any other non-transmission medium that can be used to store information for access by a computing device.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method of fabricating vertical-cavity surface-emitting lasers (VCSELs) with wafer level optics (WLO), the method comprising:
   providing a wafer having a plurality of VCSEL mesas;
   forming a first WLO on a first zone of VCSEL mesas in the plurality of VCSEL mesas, wherein the first WLO is configured to diverge a laser emission of the first zone of VCSEL mesas; and
   forming a second WLO on a second zone of VCSEL mesas in the plurality of VCSEL mesas, wherein the second WLO is configured to diverge laser emissions of the second zone of VCSEL mesas, wherein forming the first WLO and forming the second WLO includes:
   forming an optical encapsulant layer onto the plurality of VCSEL mesas;
   pressing an WLO stamp into the optical encapsulant layer, wherein the WLO stamp includes first negatives of the first WLOs aligned with the VCSEL mesas in the first zone, and wherein the WLO stamp includes second negatives of the second WLOs aligned with the VCSEL mesas in the second zone;

curing the encapsulant layer; and
removing the WLO stamp.

2. The method of claim 1, wherein the first WLO is configured to provide a first tilt angle to the laser emission of the first zone of VCSEL mesas, and wherein the second WLO is configured to provide a second tilt angle to the laser emission of the second zone of VCSEL mesas, the first tilt angle different from the second tilt angle.

3. The method of claim 1, wherein the first WLO is configured to provide a first divergence angle for beam expansion to the laser emission of the first zone of VCSEL mesas, and wherein the second WLO is configured to provide a second divergence angle to the laser emission of the second zone of VCSEL mesas, the first divergence angle different from the second divergence angle.

4. The method of claim 1 further comprising:
    forming a third WLO on a third zone of VCSEL mesas in the plurality of VCSEL mesas, wherein the third WLO is configured to diverge laser emissions of the third zone of VCSEL mesas at a third tilt angle different from a first tilt angle of the first zone and a second tilt angle of the second zone.

5. The method of claim 1, wherein each of the VCSEL mesas is configured to emit near-infrared light.

6. The method of claim 1, wherein the wafer includes a gallium arsenide substrate layer.

7. The method of claim 1, wherein the first WLO includes a refractive optic.

8. The method of claim 1 further comprising:
    dicing the wafer to form individual VCSEL illuminators out of the VCSEL mesas, wherein the individual VCSEL illuminators include either the first WLO or the second WLO.

9. The method of claim 1, wherein the first WLO includes a surface relief grating.

10. The method of claim 1, wherein the first WLO includes a blaze grating.

11. The method of claim 1, wherein the first WLO includes a metalens.

12. The method of claim 1, wherein the first WLO includes a reflective optic.

13. The method of claim 1, wherein the diameter of the VCSEL mesas in the first zone of VCSEL mesas has a same diameter as the VCSEL mesas in the second zone of VCSEL mesas.

14. The method of claim 1, wherein the first WLO has an x dimension that is less than 100 microns and has a y dimension that is less than 100 microns.

* * * * *